US009276051B2

(12) United States Patent
Sato

(10) Patent No.: US 9,276,051 B2
(45) Date of Patent: Mar. 1, 2016

(54) LIGHT-EMITTING ELEMENT DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/598,945

(22) Filed: Jan. 16, 2015

(65) Prior Publication Data

US 2015/0206929 A1    Jul. 23, 2015

(30) Foreign Application Priority Data

Jan. 17, 2014  (JP) .................................. 2014-007295

(51) Int. Cl.
*H01L 27/32*  (2006.01)

(52) U.S. Cl.
CPC ............ *H01L 27/3265* (2013.01); *H01L 27/32* (2013.01); *H01L 27/3211* (2013.01)

(58) Field of Classification Search
CPC .. H01L 27/3265; H01L 27/32; H01L 27/3211
See application file for complete search history.

(56) References Cited

U.S. PATENT DOCUMENTS

| 2007/0238217 | A1* | 10/2007 | Shih .................. G02F 1/136209 438/69 |
| 2008/0315189 | A1 | 12/2008 | Lee et al. |
| 2009/0111198 | A1* | 4/2009 | Fujikawa ............ H01L 27/1288 438/22 |
| 2009/0170230 | A1* | 7/2009 | Kidu ................... H01L 27/3211 438/35 |
| 2012/0249454 | A1* | 10/2012 | Teraguchi ............. G06F 3/0412 345/173 |
| 2014/0077176 | A1* | 3/2014 | Lee ..................... H01L 27/1255 257/40 |

FOREIGN PATENT DOCUMENTS

| JP | 2007199350 A | * | 8/2007 | ............ G02F 1/1368 |
| JP | 2008191517 A | * | 8/2008 | ................ G09F 9/30 |
| JP | 4989415 B2 | | 1/2009 | |

* cited by examiner

*Primary Examiner* — Lex Malsawma
*Assistant Examiner* — Xia L Cross
(74) *Attorney, Agent, or Firm* — Typha IP LLC

(57) ABSTRACT

A light-emitting element display device includes a substrate, one or a plurality of thin film transistors, a light-emitting element, a first electrode, and a second electrode. The substrate includes an insulating material. The thin film transistors are in each pixel of a display area on the substrate. The light-emitting element emits light by current flow in each pixel. The first electrode is between the substrate and the thin film transistors, and overlaps at least two of the thin film transistors when viewed in plan. The second electrode includes a conducting material, and is arranged across the first electrode from the substrate via an insulating film so as to form a capacitor together with the first electrode.

21 Claims, 11 Drawing Sheets

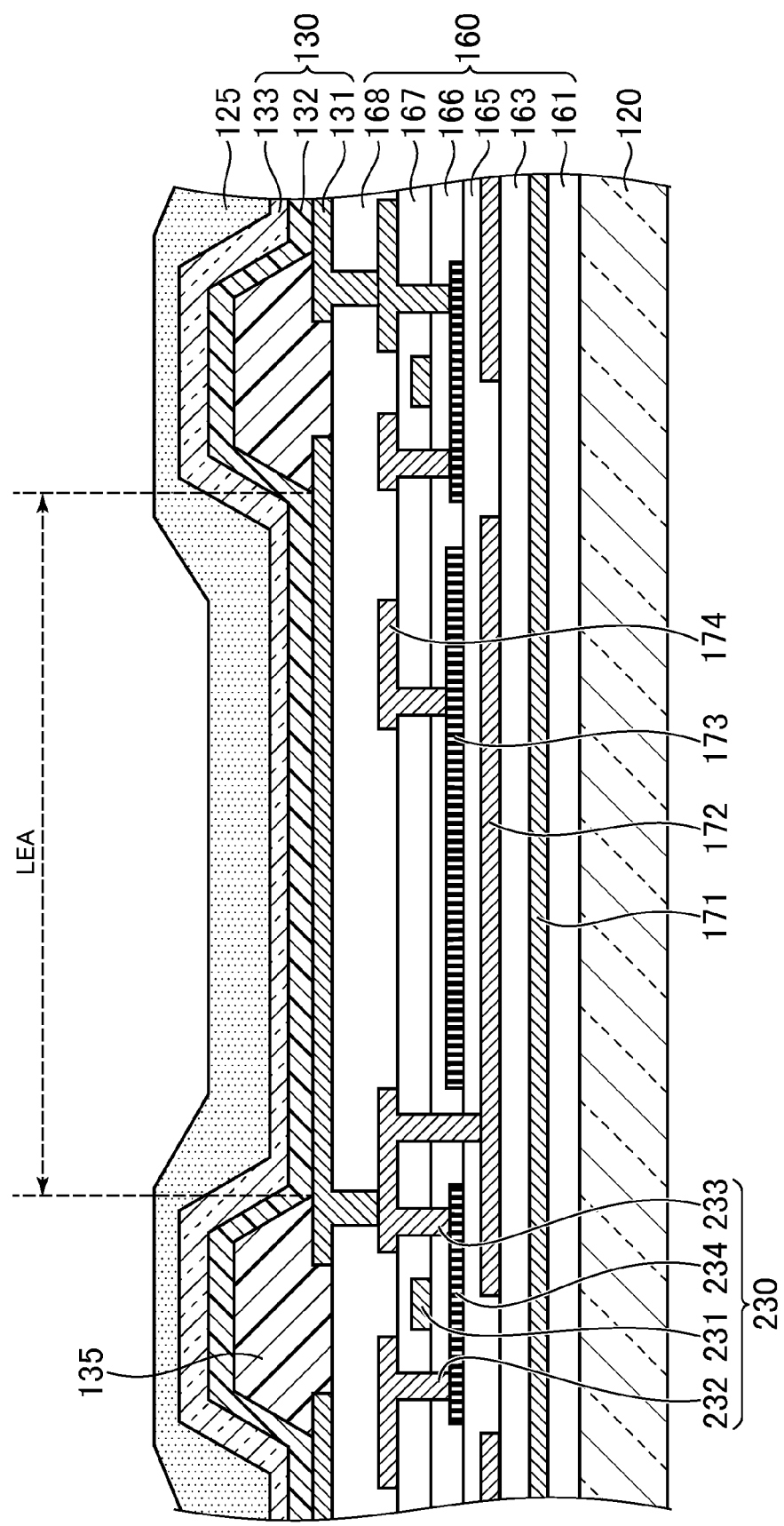

LIGHT-EMITTING ELEMENT DISPLAY DEVICE

CROSS-REFERENCE TO RELATED APPLICATION

The present application claims priority from Japanese application JP2014-007295 filed on Jan. 17, 2014, the content of which is hereby incorporated by reference into this application.

BACKGROUND OF THE INVENTION

1. Field of the Invention

The present invention relates to a light-emitting element display device.

2. Description of the Related Art

In recent years, light-emitting element display devices including self-luminous elements, such as organic light-emitting diodes (OLEDs), have been in practical use. An organic electro-luminescent (EL) display device, including such a self-luminous OLED, is excellent in visibility and response speed compared with liquid crystal display devices known in the art. Additionally, such a self-luminous OLED eliminates the need for an auxiliary lighting device, such as a backlight, from display devices, and allows them to be thinner.

JP 4989415 B discloses an organic EL display device including thin film transistors and capacitors that compensate for a threshold voltage of a driver transistor arranged in each pixel.

Recent increases in definition of light-emitting element display devices, such as the organic EL display devices described above, have led to decreases in their pixel size. Such an organic EL display device controls current in each pixel by holding a potential difference corresponding to a grayscale value of the pixel. A decrease in the size of the pixel, which causes a decrease in the size of the corresponding electrode, results in a decrease in a capacitance for holding the potential difference. When the capacitance for holding the potential difference is small, noise or a weak leakage current may change the potential difference, and thus cause uneven brightness across different pixel positions. This may result in deterioration in the display quality.

SUMMARY OF THE INVENTION

The present invention has been made with the above circumstances in mind, and it is an object of the invention to provide a light-emitting element display device that keeps its display quality high even with its definition increased.

A light-emitting element display device according to an aspect of the present invention includes a substrate, a plurality of pixels, one or a plurality of thin film transistors, a light-emitting element, a first electrode, and a second electrode. The substrate is made of an insulating material. The pixels are in a display area on the substrate. The thin film transistors are in each of the pixels. The light-emitting element emits light by current flow in each of the pixels. The first electrode is between the substrate and the thin film transistors, and overlaps at least two of the thin film transistors when viewed in plan. The second electrode is made of a conducting material, and arranged across the first electrode from the substrate via an insulating film so as to form a capacitor together with the first electrode. Here, "pixel" means a unit including a light-emitting element. When a pixel is made up of a plurality of sub-pixels each including a light-emitting element, each sub-pixel corresponds to "pixel".

In the light-emitting element display device according to the aspect, the first electrode may be across the plurality of pixels, or the first electrode may be across the display area. In this case, the first electrode may include slits, which are holes in a plurality of portions of the first electrode when viewed in plan.

In the light-emitting element display device according to the aspect, the first electrode may be connected to a reference potential for having the light-emitting element emit light in each of the pixels.

In the light-emitting element display device according to the aspect, the first electrode may be electrically connected to a cathode electrode of the light-emitting element, and the second electrode may be electrically connected to an anode electrode of the light-emitting element.

In the light-emitting element display device according to the aspect, each of the pixels may have a pixel transistor for controlling application of a voltage corresponding to a grayscale value, and a driver transistor for controlling light emission based on a potential applied through the pixel transistor. The second electrode may be connected to a gate of the driver transistor.

In the light-emitting element display device according to the aspect, the first electrode may be connected to any one of a source and drain of the driver transistor.

The light-emitting element display device according to the aspect may further include a third electrode made of a conducting material, which is arranged across the second electrode from the substrate via an insulating film so as to form a capacitor together with the second electrode. The third electrode may be electrically connected to the first electrode so as to form a capacitor together with the second electrode.

The light-emitting element display device according to the aspect may further include a third electrode made of a conducting material, which is arranged across the second electrode from the substrate via an insulating film so as to form a capacitor together with the second electrode. The first electrode may be connected to the cathode electrode of the light-emitting element. The second electrode may be connected to any one of a source and drain of the driver transistor. The third electrode may be connected to a gate of the driver transistor.

A light-emitting element display device according to another aspect of the present invention includes a substrate, a plurality of pixels, one or a plurality of thin film transistors, a light-emitting element, a first electrode, and a second electrode. The substrate is made of an insulating material. The pixels are in a display area on the substrate. The thin film transistors are in each of the pixels. The light-emitting element includes an organic layer including a light-emitting layer, an anode electrode, and a cathode electrode. The first electrode is between the substrate and the thin film transistors, and overlaps at least two of the thin film transistors when viewed in plan. The second electrode is arranged across the first electrode from the substrate via an insulating film, and is opposite the first electrode.

A light-emitting element display device according to still another aspect of the present invention includes a substrate, a plurality of pixels, one or a plurality of thin film transistors, a light-emitting element, a second semiconductor layer, a first electrode, and a second electrode. The substrate is made of an insulating material. The pixels are in a display area on the substrate. The thin film transistors are in each of the plurality of pixels, and have a first semiconductor layer. The light-emitting element includes an organic layer including a light-emitting layer, an anode electrode, and a cathode electrode. The second semiconductor layer is in a layer identical to the first semiconductor layer. The first electrode is between the substrate and the thin film transistors. The second electrode is arranged across the first electrode from the substrate via an insulating film, and is opposite the first electrode. The first electrode overlaps the second semiconductor layer and the first semiconductor layer of at least one of the thin film transistors when viewed in plan.

BRIEF DESCRIPTION OF THE DRAWINGS

FIG. 12 is a cross-sectional view showing a fourth modification of the embodiment.

DETAILED DESCRIPTION OF THE INVENTION

Embodiments of the present invention will be described below with reference to the accompanying drawings. The disclosure herein is merely an example, and any modification coming within the spirit of the present invention and obvious to those skilled in the art is intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
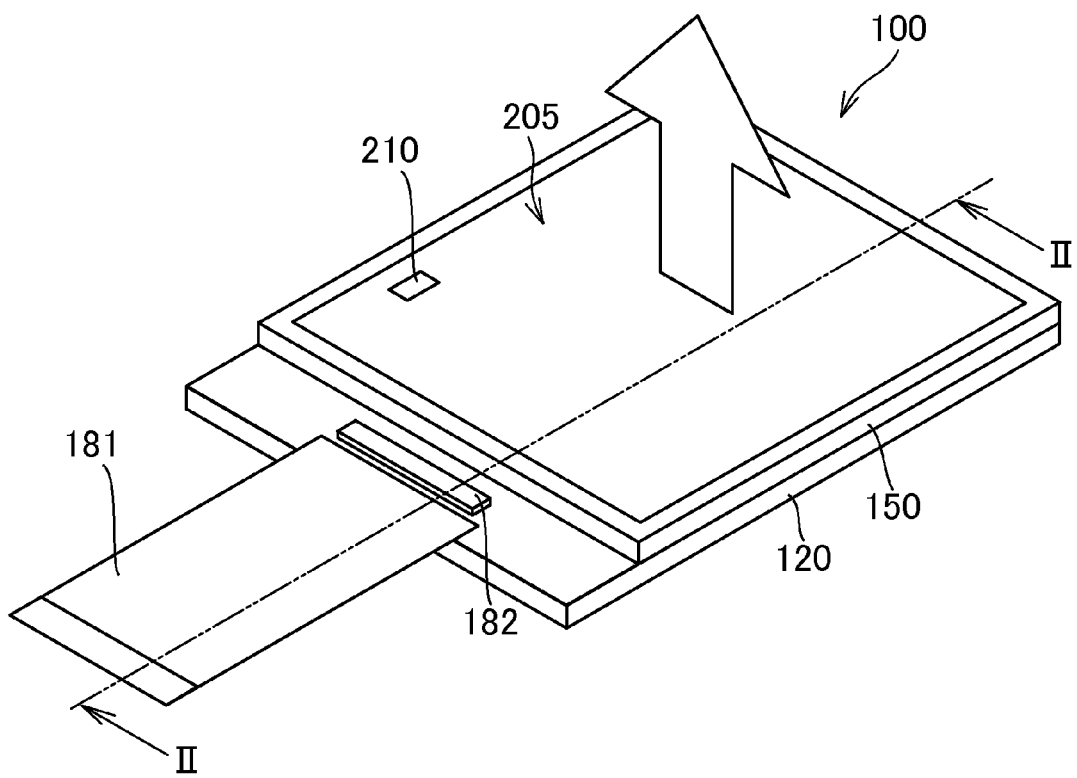
FIG. 1 is a diagram schematically showing an organic EL display device according to an embodiment of the present invention.

FIG. 1 schematically shows an organic EL display device 100 that is a light-emitting element display device according to an embodiment of the present invention. As shown in the figure, the organic EL display device 100 includes a thin film transistor (TFT) substrate 120, a counter substrate 150, and a transparent resin filler 191 (see FIG. 2) sealed between these two substrates. A display area 205 including pixels 210 arranged in a matrix is formed on the TFT substrate 120 and counter substrate 150 of the organic EL display device 100. Each pixel 210 includes a plurality of sub-pixels 212 described below.

The TFT substrate 120 is a substrate including a transparent glass or a resin insulation material. A driver integrated circuit (IC) 182 is disposed on the TFT substrate 120. The driver IC 182 applies a potential for conducting between the source and drain of a TFT (pixel transistor 220 described below) arranged in each sub-pixel 212 to the corresponding scan line 262, and applies a voltage corresponding to a grayscale value of each sub-pixel 212 to the corresponding data line 261 described below. A flexible printed circuit (FPC) 181 is mounted on the TFT substrate 120. The FPC 181 inputs external signals including image signals. As indicated by the arrow in the figure, the organic EL display device in this embodiment is a top-emitting organic EL display device that emits light toward a light-emitting layer side of the TFT substrate 120.

Figure 2:
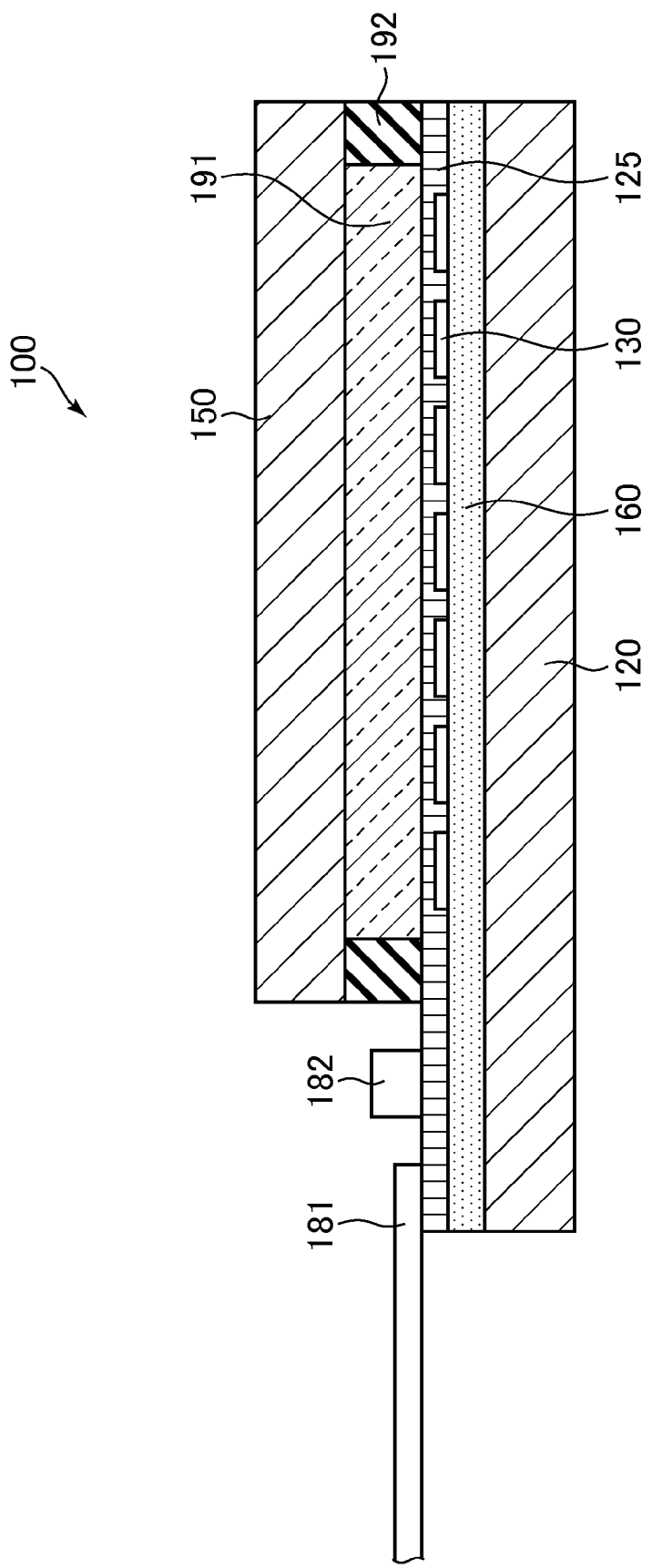
FIG. 2 is a diagram schematically showing a cross section taken along line II-II in FIG. 1.

FIG. 2 is a diagram schematically showing a cross section taken along line II-II in FIG. 1. As shown in this cross-sectional view, the TFT substrate 120 includes a TFT circuit layer 160, a plurality of organic EL elements 130, and a sealing film 125. TFT circuit layer 160 includes a TFT circuit. The organic EL elements 130 are a plurality of light-emitting elements formed on the TFT circuit layer 160. The sealing film 125 covers the organic EL elements 130 to block moisture. As many organic EL elements 130 as the sub-pixels 212 are formed in each pixel 210, which is briefly shown in FIG. 2 for clarity of illustration. A color filter and a black matrix are formed on the counter substrate 150. The color filter allows light with different wavelength regions, for example, three or four colors of light to pass through it. The black matrix is a light-blocking film that blocks light emitted from the boundaries between the sub-pixels 212. The filler 191 sandwiched between the TFT substrate 120 and the counter substrate 150 is sealed by a sealant 192.

Figure 3:
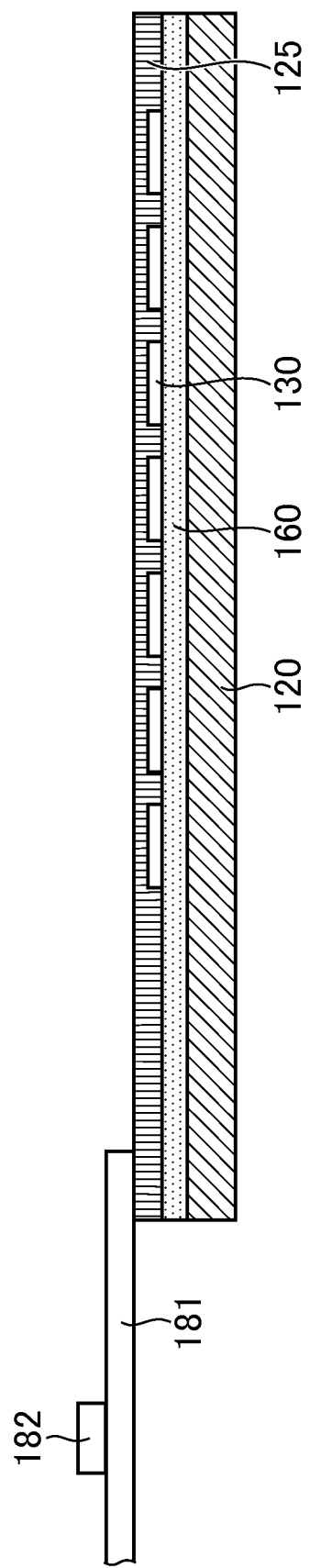
FIG. 3 is a diagram showing an example of an organic EL display device without a counter substrate.

Whereas the organic EL display device 100 in this embodiment includes the counter substrate 150 as shown in FIG. 2, the organic EL display device 100 can be configured without the counter substrate 150 as shown in FIG. 3. As also shown in FIG. 3, the driver IC 182 may be arranged on the FPC 181. Especially when the TFT substrate 120 is made of a flexible resin material, the TFT substrate 120 may be integrated with the FPC 181. Whereas the organic EL element 130 in this embodiment emits white light and the color filter allows the light with three or four colors of wavelength regions to pass through it, the organic EL element 130 may emit light with different wavelength regions, for example, three or four colors of light.

Figure 4:
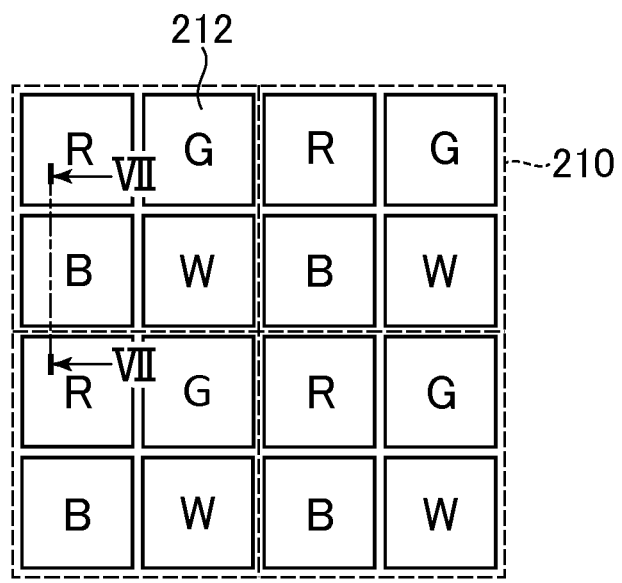
FIG. 4 is a diagram showing an example arrangement of sub-pixels included in the pixel shown in FIG. 1.
Figure 5:
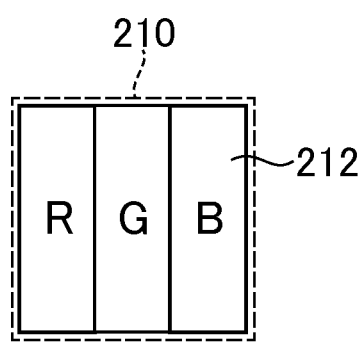
FIG. 5 is a diagram showing another example arrangement of sub-pixels included in the pixel shown in FIG. 1.

FIG. 4 is a diagram showing an example arrangement of the sub-pixels 212 included in the pixel shown in FIG. 1. As shown in the diagram, the pixel 210 includes the sub-pixels 212 each being substantially rectangular and emitting light with any one of the wavelength regions corresponding to four colors: red (R), green (G), blue (B), and white (W). The sub-pixels 212 within the same pixel 210 are arranged in a two-by-two matrix so that two sides of each sub-pixel 212 are in contact with the adjoining sub-pixels 212. The arrangement of the sub-pixels 212 within the pixel 210 is not limited to the arrangement shown in FIG. 4. Alternatively, the pixel 210 may include the sub-pixels 212 arranged in a stripe pattern corresponding to three colors RGB as shown in FIG. 5 or in another stripe pattern corresponding to four colors RGBW. The arrangement of the sub-pixels 212 constituting the pixel 210 is not limited to these arrangements, and can be determined as appropriate.

Figure 6:
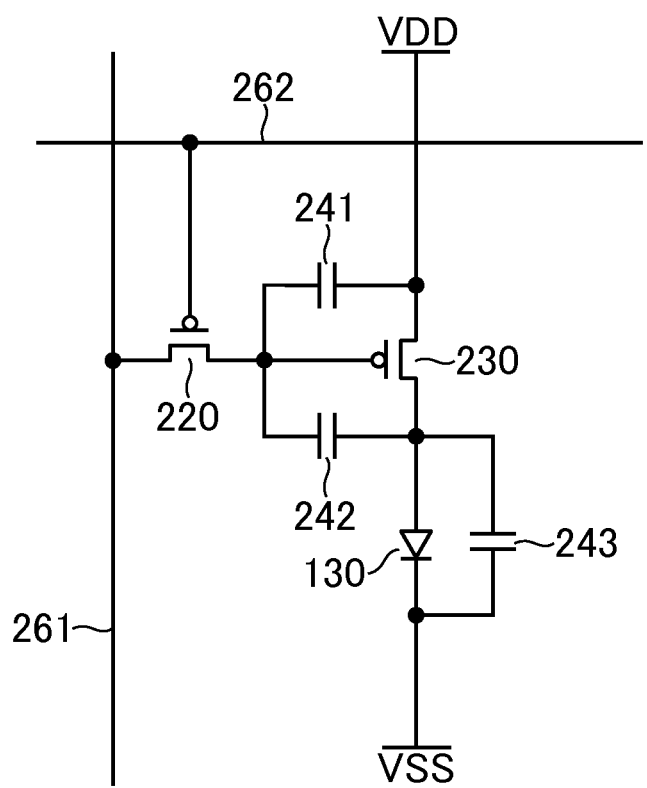
FIG. 6 is a circuit diagram showing an example of a circuit in the sub-pixel.

FIG. 6 is a circuit diagram showing an example of a circuit in the sub-pixel 212. An operation of the circuit for light emission will be described with reference to the diagram. When an image signal corresponding to a grayscale value of each sub-pixel 212 is applied to the data line 261, the pixel transistor 220 conducts based on a signal through the scan line 262. A voltage based on the grayscale value is thus stored across a capacitor 241 and/or a capacitor 242. A TFT driver transistor 230 then passes a current based on the voltage stored across the capacitor 241 and/or the capacitor 242. Thus, the organic EL element 130 emits light. A capacitor 243 is located between the anode and cathode of the organic EL element 130. The cathode side of the organic EL element 130 is connected to a low reference potential VSS. The source side (the opposite side from the organic EL element 130) of the driver transistor 230 is held at a high reference potential VDD.

Here, it is optional whether to form the capacitors 241, 242, and 243. All of the capacitors may be formed. Alternatively, any one or any two of the capacitors may be formed. Whereas p-type semiconductors are used in the circuit diagram, n-type semiconductors may be used. The circuit shown in FIG. 6 is a simplified circuit for explaining a light emission control, and thus includes two transistors. Alternatively, the circuit may include three or more transistors, or may include other control lines and capacitors. The configuration of the circuit may be determined optionally.

Figure 7:
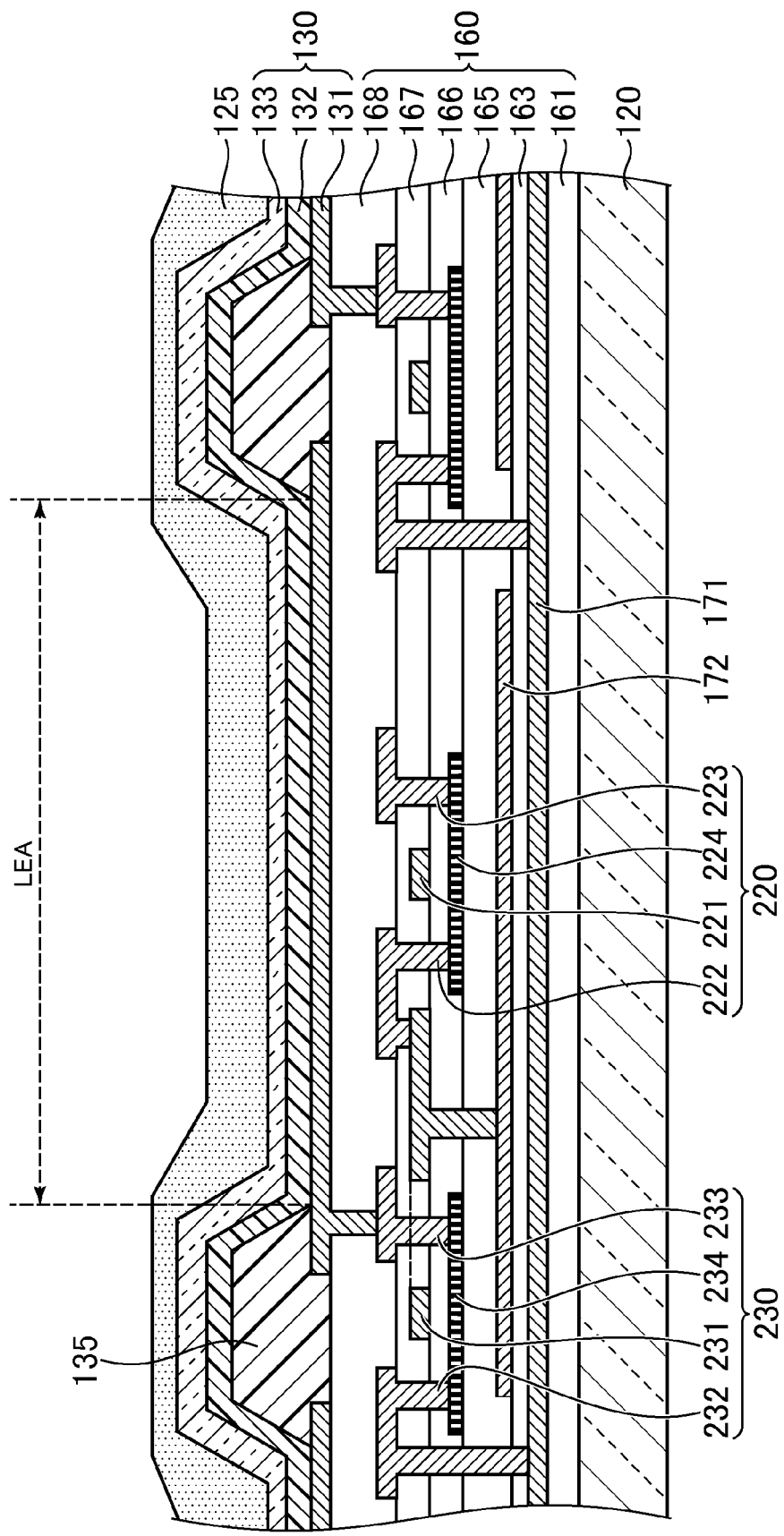
FIG. 7 is a diagram showing a cross section taken along line VII-VII in FIG. 4.

FIG. 7 is a diagram schematically showing a cross section taken along line VII-VII in FIG. 4. In this diagram, the filler 191 and the counter substrate 150 are not shown and only the TFT substrate 120, the TFT circuit layer 160, the organic EL element 130, and the sealing film 125 are shown. As shown in the diagram, the TFT circuit layer 160 includes the pixel transistor 220, the driver transistor 230, and a first electrode 171. The first electrode 171 is arranged between the pixel transistor 220 and the driver transistor 230, and the TFT substrate 120. The first electrode 171 overlaps at least a portion of the driver transistor 230 and at least a portion of the pixel transistor 220 when viewed in plan. A second electrode 172 is arranged across the first electrode 171 from the TFT substrate 120, here between the pixel transistor 220 and the driver transistor 230, and the first electrode 171. The second electrode 172 thus forms a capacitor together with the first electrode 171 via an insulating film 163. In this embodiment, the first electrode 171 is formed covering the plurality of sub-pixels 212 and the display area 205, and overlapping the display area 205, when viewed in plan.

Here, the first electrode 171 can be made of a metal containing at least any one of molybdenum (Mo) and tungsten (W), and can be a solid electrode that covers the display area 205. Use of a refractory metal, such as a metal containing MO or W, can prevent degradation of the electrode caused by melting or the like even in a heating process during manufacture, and maintain quality. This is effective especially when a semiconductor layer 224 or 234 is made of polysilicon or other semiconductors. The second electrode 172 can also be made of a refractory metal containing at least any one of Mo and W. This also produces similar effects. Use of a high-dielectric material, such as SiN, in the insulating film 163 can increase the electric capacitance of the capacitor formed by the first electrode 171 and the second electrode 172. The second electrodes 172 are separately formed corresponding one-to-one to the sub-pixels 212, and connected to the circuits in the sub-pixels 212. An underlayer 161 made of SiNx or other insulating materials is formed between the first electrode 171 and the TFT substrate 120.

The driver transistor 230 includes a gate 231, a source 232, and a drain 233. A semiconductor layer 234 is arranged between the source 232 and the drain 233. The pixel transistor 220 includes a gate 221, a source 223, and a drain 222. A semiconductor layer 224 is arranged between the source 223 and the drain 222. The drain 222 of the pixel transistor 220 and the gate 231 of the driver transistor 230 are connected to each other. An insulating film 166 made of SiNx or other insulating materials is formed between the semiconductor layers 224 and 234, and the gates 221 and 223. An insulating film 167 made of SiNx or other insulating materials is formed on the gates 221 and 231. A planarization film 168 made of an organic insulating material is formed on the pixel transistor 220 and the driver transistor 230.

The organic EL element 130 includes an anode electrode 131, an inter-pixel insulating film 135, an organic layer 132, and a cathode electrode 133. The anode electrode 131 is connected to the drain 233 of the driver transistor 230 through a contact hole in the planarization film 168. The inter-pixel insulating film 135 covers the edge of the anode electrode 131 with an organic insulating material to insulate the anode electrode 131 from the anode electrode 131 of the adjacent sub-pixel 212. The organic layer 132 is formed in contact with the anode electrode 131 of each sub-pixel 212 so as to cover the display area 205. The cathode electrode 133 is a transparent conductive film made of a composite oxide of indium and tin, a composite oxide of indium and zinc, or other composite oxides. A light-emitting area LEA is the area where the anode electrode 131 is in contact with the organic layer 132.

In the configuration as described above, the first electrode 171 is connected to the source 232 of the driver transistor 230, and connected to the high reference potential VDD at a plurality of portions outside the display area 205 to be maintained at the high reference potential VDD. The second electrode 172 is connected to the gate 231 of the driver transistor 230 (i.e., the drain 222 of the pixel transistor 220). The first electrode 171 and the second electrode 172 thus form the capacitor 241 shown in the circuit diagram of FIG. 6. The first electrode 171 and the second electrode 172 form the capacitor 241 with high capacitance, and thus can stabilize current provided to the organic EL element 130. Such capacitor can be formed without affecting the circuit configuration because the first electrode 171 and the second electrode 172 are formed near the TFT substrate 120 side of the driver transistor 230 and pixel transistor 220. The first electrode 171 is connected to the high reference potential VDD and formed overlapping the display area 205, and thus can more evenly provide the high reference potential VDD to the display area 205. In addition, the first electrode 171 eliminates the need for another line for providing the high reference potential VDD within the circuit in the each sub-pixel 212, and thus allows the driver transistor 230 or the pixel transistor 220 to be larger. Connecting the first electrode 171 to the high reference potential VDD at a plurality of portions outside the display area 205 can provide the first electrode 171 with more stable potential. The first electrode 171 is formed overlapping the display area 205. This configuration can efficiently dissipate heat generated in the organic EL element 130 and shield electromagnetic noise generated in the circuits.

In the embodiment described above, the first electrode 171 is connected to the source 232 of the driver transistor 230 and the second electrode 172 is connected to the gate 231 of the driver transistor 230. Alternatively, the first electrode 171 may be connected to the low reference potential VSS, to which the cathode electrode of the organic EL element 130 is connected, that is, to the cathode electrode of the organic EL element 130, in the display area 205. In addition to this, the second electrode 172 may be connected to the drain 233 of the driver transistor 230, that is, to the anode electrode of the organic EL element 130. Such alternative configuration can also form the capacitor 243.

Figure 8:
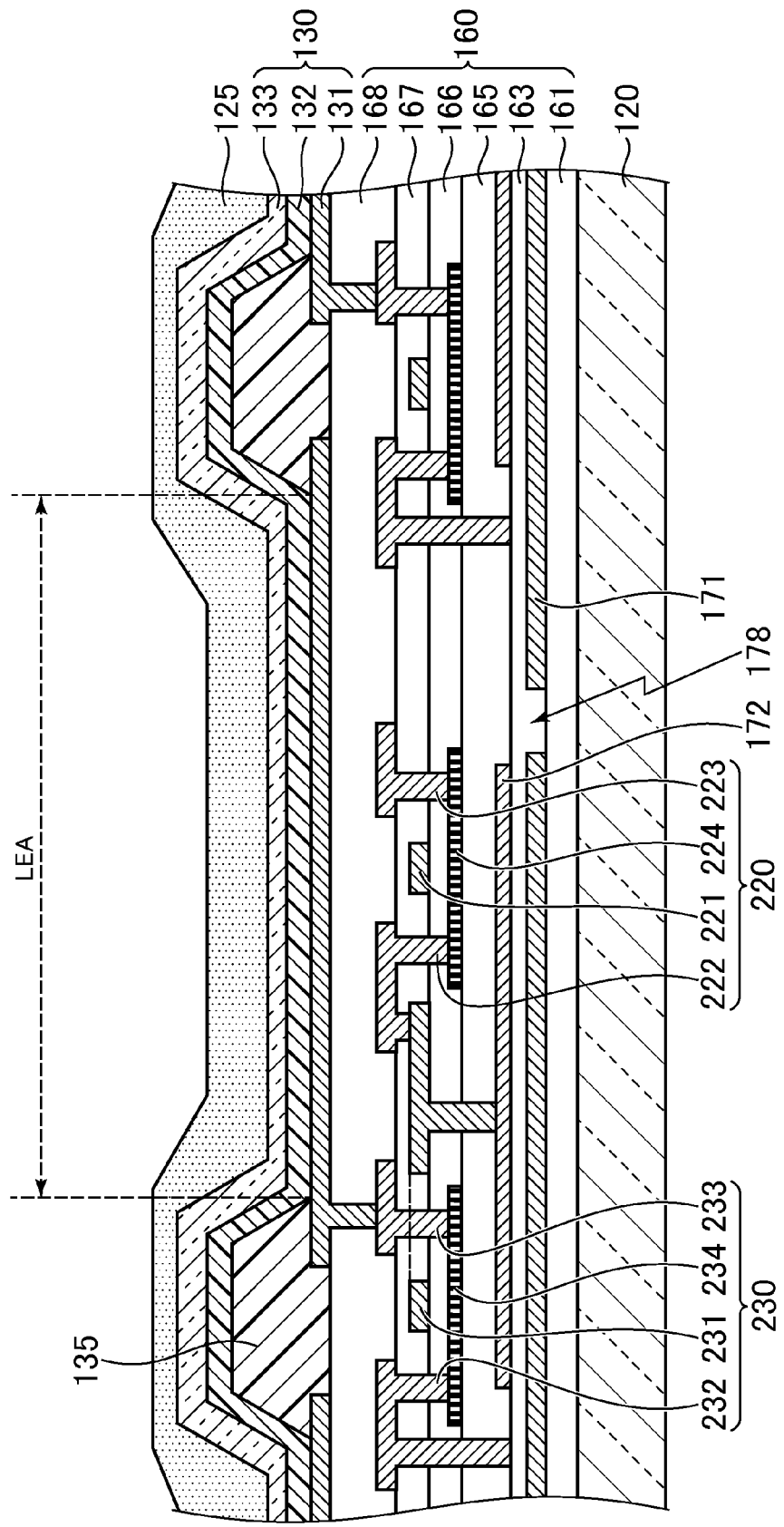
FIG. 8 is a cross-sectional view showing a first modification of the embodiment when viewed from the same direction as FIG. 7.
Figure 9:
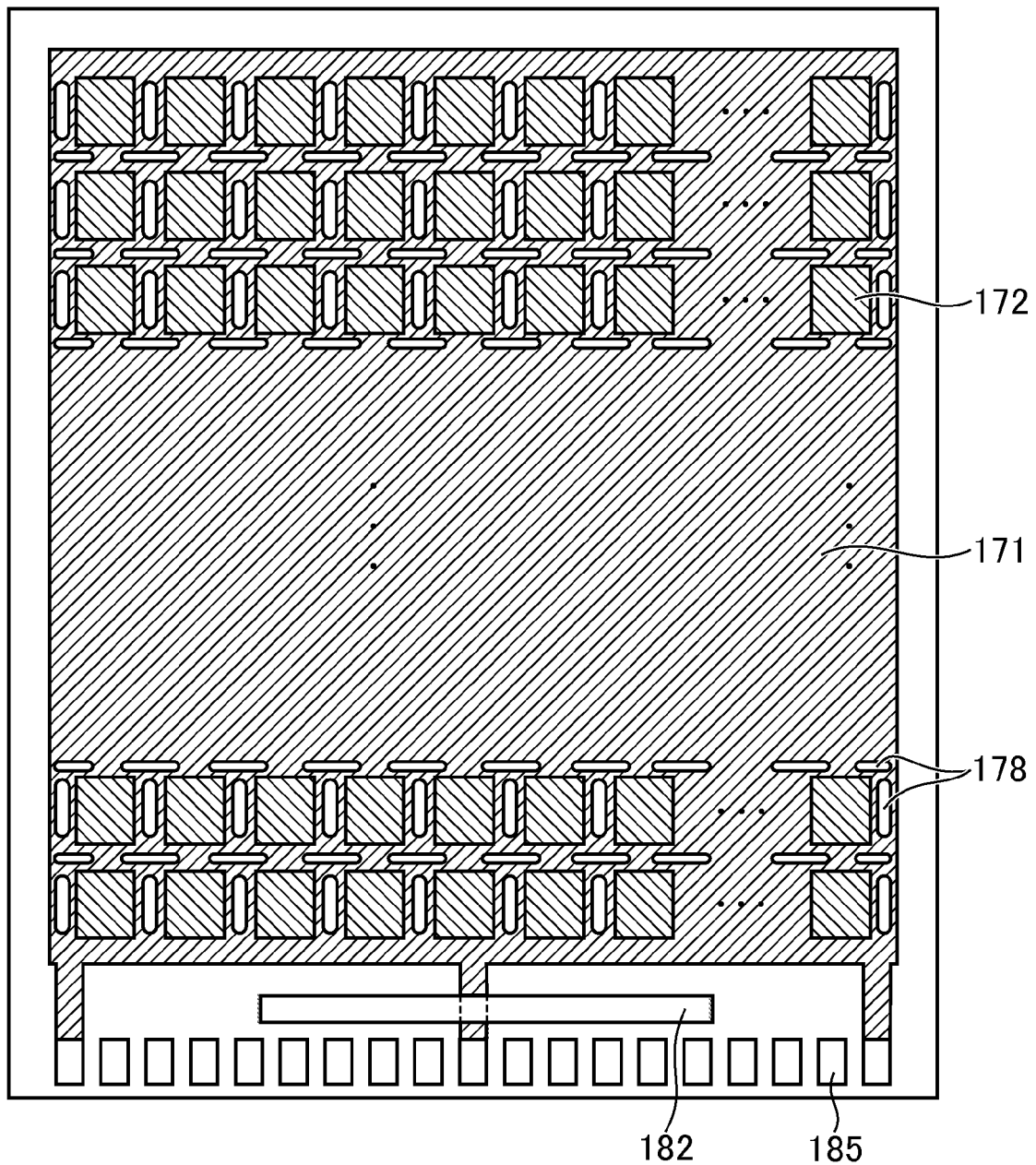
FIG. 9 is a diagram schematically showing an arrangement of first and second electrodes according to the first modification shown in FIG. 8, when viewed in plan.

FIG. 8 is a cross-sectional view showing a first modification of the embodiment described above when viewed from the same direction as FIG. 7. In the embodiment described above, the first electrode 171 is a solid electrode that covers the display area 205. By contrast, the first modification differs from the embodiment in that a slit 178, a hole, is formed in a portion of the first electrode 171. FIG. 9 is a diagram schematically showing an arrangement of the first electrode 171 and the second electrode 172 when viewed in plan. As shown in the diagram, the second electrodes 172 are separately arranged corresponding one-to-one to the sub-pixels 212 so as to overlap the first electrode 171 that overlaps the entirety of the display area 205. The slits 178 in the first electrode 171 are disposed in portions that does not overlap the second electrodes 172 so that the first electrode 171 forms a capacitance together with the second electrodes 172. The first electrode 171 is electrically connected to a plurality of terminals 185 outside the display area 205, and maintained at the high reference potential VDD.

Such configuration can relieve stress that occurs in the first electrode 171 and efficiently dissipate heat, in addition to the effects according to the embodiment described above. Whereas the slit 178 is formed in a hole shape in FIG. 8, the slit 178 may extend across the first electrode 171 so as to cut it. Also in such a case, each first electrode 171 is formed to overlap at least a portion of the driver transistor 230 and at least a portion of the pixel transistor 220 when viewed in plan, and connected to a fixed potential, such as the high reference potential VDD.

Figure 10:
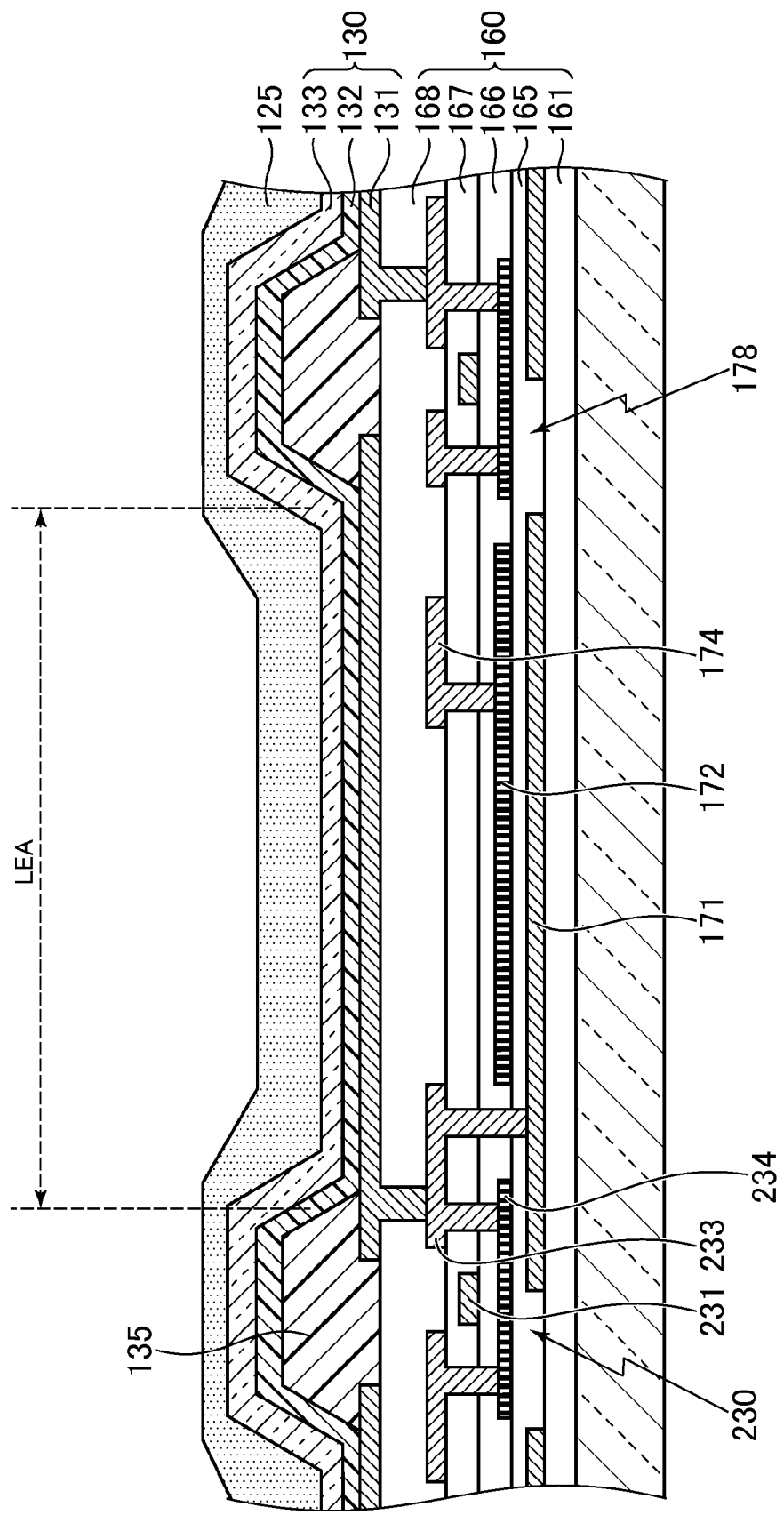
FIG. 10 is a cross-sectional view showing a second modification of the embodiment.

FIG. 10 is a cross-sectional view showing a second modification of the embodiment described above. Unlike FIG. 7, this cross-sectional view shows a cross section of a portion where no pixel transistors 220 are formed. As shown in the cross-sectional view, the second electrode 172 is formed using a layer identical to any of a plurality of layers constituting TFTs, in a portion where no pixel transistor 220 are formed. As shown especially in FIG. 10, the second electrode 172 is formed using the layer identical to the semiconductor layer 234. Thus, the second electrode 172 can be used as a conductor by, for example, changing the amount of ions implanted to the semiconductor layer 234 made of low-temperature polysilicon. Alternatively, the second electrode 172 may be formed using a conducting layer including source and drain electrodes.

Here, the slit 178 vertically and horizontally extends across the first electrode 171 when viewed in plan to form electrodes electrically separated for each sub-pixel 212. However, the first electrodes 171 electrically separated for each sub-pixel 212 are arranged to overlap at least a portion of the pixel transistor 220 and at least a portion of the driver transistor 230 when viewed in plan. The first electrode 171 is connected to the drain 233 of the driver transistor 230, and the second electrode 172 is connected to the gate 231 of the driver transistor 230 via a bridge 174 made of a conductor. Thus, the first electrode 171 and the second electrode 172 form the capacitor 242 shown in FIG. 6.

The first electrode 171 and the second electrode 172 according to the second modification also form the capacitor 242 with high capacitance, and thus can stabilize current provided to the organic EL element 130. Such capacitor can be formed without affecting the circuit configuration because the first electrode 171 and the second electrode 172 are formed overlapping transistors. Furthermore, the first electrode 171 and the second electrode 172 can efficiently dissipate heat generated in the organic EL element 130 and shield electromagnetic noise generated in the circuits.

Figure 11:
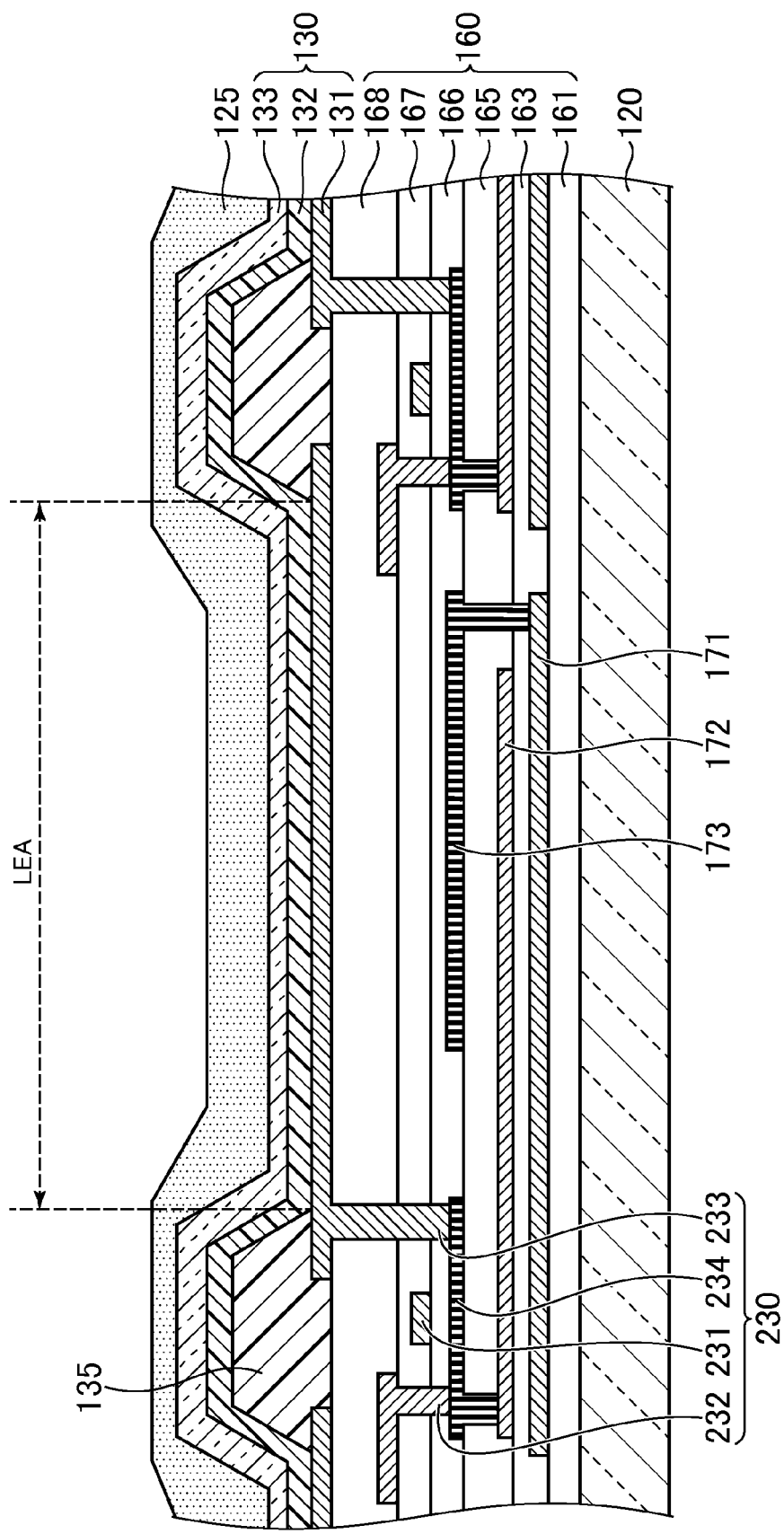
FIG. 11 is a cross-sectional view showing a third modification of the embodiment.

FIG. 11 is a cross-sectional view showing a third modification of the embodiment described above. Like the second modification, this cross-sectional view shows a cross section of a portion where no pixel transistors 220 are formed. As shown in the cross-sectional view, the TFT circuit layer 160 includes a third electrode 173 as well as the first electrode 171 and the second electrode 172. The first electrode 171 and the second electrode 172 are arranged between the driver transistor 230 and the pixel transistor 220, and the TFT substrate 120. The first electrode 171 overlaps at least a portion of the driver transistor 230 and at least a portion of the pixel transistor 220. The third electrode 173 is formed using a layer identical to any of a plurality of layers constituting transistors, in a portion where no pixel transistor 220 are formed. In FIG. 11, the third electrode 173 is formed using the layer identical to the semiconductor layer 234. Thus, the third electrode 173 can be used as a conductor by changing, for example, the amount of ions implanted to the semiconductor layer 234 made of low-temperature polysilicon, like the second modification. Alternatively, the third electrode 173 may be formed using a conducting layer including source and drain electrodes. Here, the first electrode 171 and the second electrode 172 can be made of a refractory metal containing at least any one of Mo and W.

The first electrode 171 and the third electrode 173 are electrically connected to each other, and overlap each other so as to sandwich the second electrode 172 between them. This configuration increases a capacitance formed between the first electrode 171 and the third electrode 173, and the second electrode 172. Here, the second electrode 172 is connected to the source 232 of the driver transistor 230, and the first electrode 171 and the third electrode 173 are connected to the gate 231 of the driver transistor 230. Thus, the first electrode 171 and the third electrode 173, and the second electrode 172 form the capacitor 241 shown in FIG. 6.

The first electrode 171 and the second electrode 172 according to the third modification also form the capacitor 241 with high capacitance, and thus can stabilize current provided to the organic EL element 130. Such higher capacitor can be formed without affecting the circuit configuration because the first electrode 171 and the second electrode 172 are formed overlapping transistors. Furthermore, the first electrode 171 and the second electrode 172 can efficiently dissipate heat generated in the organic EL element 130 and shield electromagnetic noise generated in the circuits.

FIG. 12 is a cross-sectional view showing a fourth modification of the embodiment described above. The fourth modification includes the first electrode 171, the second electrode 172, and the third electrode 173 like the third modification, but differs from the third modification in that the first electrode 171 is not electrically connected to the third electrode 173. In such a case, for example, the first electrode 171 is connected to the low reference potential VSS identical to the potential of the cathode electrode 133, and third electrode 173 is connected to the gate 231 of the driver transistor 230 via the bridge 174. This configuration can form the capacitors 242 and 243 shown in FIG. 6. The configuration can form high capacitance more efficiently, stabilize potential, and thus improve display quality.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A light-emitting element display device comprising:
a substrate made of an insulating material;
a plurality of pixels in a display area on the substrate;
a plurality of thin film transistors in each of the plurality of pixels;

a light-emitting element for emitting light by current flow in each of the pixels;

a first electrode between the substrate and the thin film transistors, the first electrode overlapping with at least two of the thin film transistors in a plan view; and a second electrode made of a conductive material, the second electrode provided on a side of the first electrode via an insulating film so as to form a capacitor together with the first electrode, the first electrode between the second electrode and the substrate.

2. The light-emitting element display device according to claim 1, wherein the first electrode spreads under two or more of the plurality of pixels.

3. The light-emitting element display device according to claim 1, wherein the first electrode spreads under the display area.

4. The light-emitting element display device according to claim 3, wherein the first electrode has slits, which are holes at multiple spots of the first electrode in a plan view.

5. The light-emitting element display device according to claim 1, wherein the first electrode is coupled to a reference potential for activating the light-emitting element to emit light in each of the pixels.

6. The light-emitting element display device according to claim 1, wherein the light-emitting element is provided with an organic layer including a light-emitting layer, an anode electrode, and a cathode electrode, the first electrode is electrically coupled to the cathode electrode, and the second electrode is electrically coupled to the anode electrode.

7. The light-emitting element display device according to claim 1, wherein the thin film transistors in each of the pixels include:

a pixel transistor for controlling an applied voltage corresponding to a grayscale value;

a driver transistor for controlling light emission based on a potential applied through the pixel transistor, and the second electrode is coupled to a gate of the driver transistor.

8. The light-emitting element display device according to claim 7, wherein the first electrode is coupled to one of a source and a drain of the driver transistor.

9. The light-emitting element display device according to claim 1, further comprising:

a third electrode made of a conductive material, the third electrode provided on a side of the second electrode via an insulating film so as to form a capacitor together with the second electrode, wherein the second electrode is between the third electrode and the substrate, and the third electrode is electrically coupled to the first electrode so as to form a capacitor together with the second electrode.

10. The light-emitting element display device according to claim 9, wherein the thin film transistors each have a semiconductor layer, and the third electrode lies at a same level as the semiconductor layer.

11. The light-emitting element display device according to claim 1, further comprising:

a third electrode made of a conductive material, the third electrode provided on a side of the second electrode via an insulating film so as to form a capacitor together with the second electrode, wherein the second electrode is between the third electrode and the substrate, the first electrode is coupled to a cathode electrode of the light-emitting element, the second electrode is coupled to one of a source and a drain of the driver transistor, and the third electrode is coupled to a gate of the driver transistor.

12. A light-emitting element display device comprising:

a substrate made of an insulating material;

a plurality of pixels in a display area on the substrate;

a plurality of thin film transistors in each of the plurality of pixels;

a light-emitting element provided with an organic layer including a light-emitting layer, an anode electrode, and a cathode electrode;

a first electrode between the substrate and the thin film transistors, the first electrode overlapping with at least two of the thin film transistors in a plan view; and a second electrode provided on a side of the first electrode via an insulating film so as to form a capacitor together with the first electrode, the first electrode between the second electrode and the substrate.

13. The light-emitting element display device according to claim 12, wherein the first electrode is coupled to one of a source and drain of one of the thin film transistors.

14. The light-emitting element display device according to claim 12, wherein the second electrode is coupled to a gate of one of the thin film transistors.

15. The light-emitting element display device according to claim 13, wherein the thin film transistors each have a semiconductor layer, and the second electrode lies at a same level as the semiconductor layer.

16. The light-emitting element display device according to claim 12, wherein the first electrode is electrically coupled to the cathode electrode.

17. The light-emitting element display device according to claim 12, wherein the second electrode is electrically coupled to the anode electrode.

18. A light-emitting element display device comprising:

a substrate made of an insulating material;

a plurality of pixels in a display area on the substrate;

a plurality of thin film transistors in each of the plurality of pixels, the thin film transistors each having a first semiconductor layer;

a light-emitting element provided with an organic layer including a light-emitting layer, an anode electrode, and a cathode electrode;

a second semiconductor layer lying at a same level as the first semiconductor layers;

a first electrode between the substrate and the thin film transistors; and a second electrode provided on a side of the first electrode via an insulating film so as to form a capacitor together with the first electrode, wherein the first electrode is between the second electrode and the substrate, and the first electrode overlaps with the second semiconductor layer and the first semiconductor layers of at least two of the thin film transistors in a plan view.

19. The light-emitting element display device according to claim 18, wherein
the second electrode is the second semiconductor layer.

20. The light-emitting element display device according to claim 18, wherein
the first electrode is electrically coupled to the second semiconductor layer, and
the second electrode lies between the first electrode and the second semiconductor layer.

21. The light-emitting element display device according to claim 18, wherein
each of the pixels has a light-emitting area, and
the second semiconductor layer overlaps with the light-emitting area in a plan view.

* * * * *